United States Patent
He et al.

(10) Patent No.: US 11,785,849 B2
(45) Date of Patent: Oct. 10, 2023

(54) THERMOELECTRIC POWER GENERATOR

(71) Applicant: XI'AN JIAOTONG UNIVERSITY, Shaanxi (CN)

(72) Inventors: Hailong He, Shaanxi (CN); Yi Wu, Shaanxi (CN); Chunping Niu, Shaanxi (CN); Mingzhe Rong, Shaanxi (CN); Zhenxuan Fang, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 22 days.

(21) Appl. No.: 17/317,852

(22) Filed: May 11, 2021

(65) Prior Publication Data
US 2022/0069189 A1 Mar. 3, 2022

(30) Foreign Application Priority Data
Sep. 1, 2020 (CN) .......................... 202010906894.6

(51) Int. Cl.
*H10N 10/17* (2023.01)
*H10N 10/817* (2023.01)

(52) U.S. Cl.
CPC ........... *H10N 10/17* (2023.02); *H10N 10/817* (2023.02)

(58) Field of Classification Search
CPC ......... H01L 35/08; H01L 35/32; H10N 10/17; H10N 10/817
See application file for complete search history.

(56) References Cited

U.S. PATENT DOCUMENTS

| 3,451,126 A | * | 6/1969 | Yamamoto | H01L 51/05 257/1 |
| 2012/0049315 A1 | * | 3/2012 | Kim | H01L 35/34 438/54 |
| 2013/0104951 A1 | * | 5/2013 | Savelli | H01L 35/28 136/203 |

* cited by examiner

*Primary Examiner* — Tamir Ayad
(74) *Attorney, Agent, or Firm* — Dragon Sun Law Firm, PC; Nathaniel Perkins

(57) ABSTRACT

In the thermoelectric power generator, a first heat insulation layer is paved on a partial lower surface of a first heat conduction and insulation end surface; a first electric conduction electrode is arranged on a lower surface of the first heat conduction layer and a lower surface of the first heat conduction and insulation end surface; a second electric conduction electrode is arranged opposite to the first electric conduction electrode and adaptive to the first electric conduction electrode; a thermoelectric component includes a plurality of P—N type thermoelectric arms connected in series; and a second heat conduction and insulation end surface is arranged opposite to the first heat conduction and insulation end surface, and an upper surface of the second heat conduction and insulation end surface is in partial contact with the second electric conduction electrode and in partial contact with the second heat insulation layer.

4 Claims, 1 Drawing Sheet

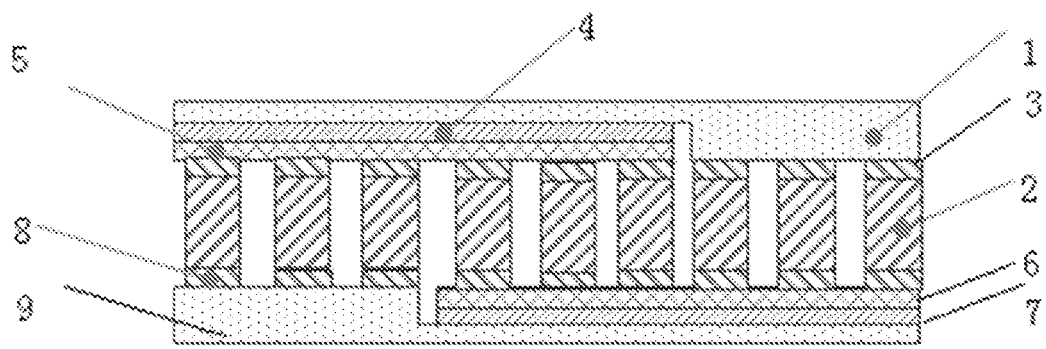

THERMOELECTRIC POWER GENERATOR

CROSS-REFERENCE TO RELATED APPLICATION

The present application is filed based on and claims priority to Chinese patent application No. 2020109068946 filed on Sep. 1, 2020, which is incorporated herein by reference in its entirety.

FIELD

The present invention relates to the technical field of thermoelectric power generators and particularly relates to a thermoelectric power generator.

BACKGROUND

The thermoelectric power generator utilizes a seebeck effect of a thermoelectric power generation material to directly utilize heat energy and convert the heat energy into electric energy. The thermoelectric power generator has the advantages of environmental protection, compact structure, no moving component, no noise, long service life, etc., and thus has broad application prospect. The thermoelectric power generator is composed of a plurality of pairs of P—N thermoelectric components which are connected in series. In a use process, a hot end surface of the thermoelectric power generator is tightly attached to a hot source, a cold end surface of the thermoelectric power generator is connected with a radiator, a temperature difference is generated between the hot and cold end surfaces of the thermoelectric power generator to generate electric potential, and the greater the temperature difference, the greater the electric potential. Therefore, the improvement of the heat dissipation effect of the radiator and the increase of the temperature difference between the cold and hot end surfaces have important significance on increase of output electric power of the thermoelectric power generator. Usually, the heat dissipation effect of the radiator can be obviously improved by increasing a volume of the radiator. However, the volume of the radiator is strictly restricted in some occasions, simple optimization of the structure of the radiator plays a limited role in improvement of the heat dissipation effect, and the output performance of the thermoelectric power generator cannot be improved greatly.

The above information disclosed in the background part is only used for enhancing the understanding of the background of the present invention, and thus may contain information that is not included in the prior art known to those of ordinary skill in the art in this country.

SUMMARY

With respect to the problems in the prior art, the present invention provides a thermoelectric power generator which solves the practical problems of small temperature difference between cold and hot end surfaces of the thermoelectric power generator and low output power under a working condition of a limited volume of a radiator, and can effectively increase the temperature difference between the end surfaces of the thermoelectric power generator in the case of a limited cooling effect of the radiator so as to increase output electric power.

The purpose of the present invention is realized by the following technical solution. A thermoelectric power generator includes:

a first heat conduction and insulation end surface, a first heat insulation layer, which is paved on a partial lower surface of the first heat conduction and insulation end surface, a first heat conduction layer, which is paved on a lower surface of the first heat insulation layer, a first electric conduction electrode, which is arranged on a lower surface of the first heat conduction layer and a lower surface of the first heat conduction and insulation end surface, a second electric conduction electrode, which is arranged opposite to the first electric conduction electrode and adaptive to the first electric conduction electrode, a thermoelectric component, which includes a plurality of P—N type thermoelectric arms connected in series, and is arranged between the first electric conduction electrode and the second electric conduction electrode, a second heat conduction layer, which is arranged adjacent to the second electric conduction electrode, a second heat insulation layer, which is paved on a lower surface of the second heat conduction layer, and a second heat conduction and insulation end surface, which is arranged opposite to the first heat conduction and insulation end surface, wherein an upper surface of the second heat conduction and insulation end surface is in partial contact with the second electric conduction electrode and in partial contact with the second heat insulation layer.

In the thermoelectric power generator, the first heat conduction and insulation end surface has a stepped structure, and the first heat insulation layer and the first heat conduction layer are arranged at a thinner position of the stepped structure, so that the first heat conduction layer is parallel and level to a thicker position of the stepped structure. The second heat conduction and insulation end surface has a stepped structure, and the second heat insulation layer and the second heat conduction layer are arranged at a thinner position of the stepped structure, so that the second heat conduction layer is parallel and level to a thicker position of the stepped structure.

In the thermoelectric power generator, an arrangement mode of the P—N type thermoelectric arms is changed into an N—P—N mode from a P—N—P mode at a heat series exchange position.

In the thermoelectric power generator, an arrangement mode of the P—N type thermoelectric arms is changed into a P—N—P mode from an N—P—N mode at a heat series exchange position.

In the thermoelectric power generator, the first heat insulation layer and/or the second heat insulation layer include/includes glass fiber, asbestos, vermiculite or a microporous calcium silicate material.

In the thermoelectric power generator, the first heat conduction layer and/or the second heat conduction layer include/includes insulation materials containing metal oxide, carbide and/or metal nitride.

In the thermoelectric power generator, the metal oxide includes magnesium oxide, aluminum oxide or nickel oxide, the carbide includes silicon carbide, and the metal nitride includes aluminum nitride or silicon nitride.

In the thermoelectric power generator, the thermoelectric component includes at least one group of heat series structures, at least one group of k thermoelectric arms and at least one group of n-k thermoelectric arms.

In the thermoelectric power generator, a heat conduction coefficient of the second heat conduction layer is the same as that of the first heat conduction layer.

In the thermoelectric power generator, a heat insulation coefficient of the second heat insulation layer is the same as that of the first heat insulation layer.

Compared with the prior art, the thermoelectric power generator has the following advantages:

compared with conventional heating, the thermoelectric power generator is reasonable in design and relatively simple in structure; heat series connection between the thermoelectric arms is realized by adding a heat insulation material layer and a heat conduction material layer between each of the end surfaces of the thermoelectric power generator and each of the electric conduction electrodes, for example, the first heat conduction and insulation end surface is a cold end, the second heat conduction and insulation end surface 9 is a hot end, and heat is conducted upwards to the first heat conduction layer 5 from the second heat conduction and insulation end surface 9 along a left side, then is isolated by a gap, is conducted downwards, then is conducted upwards by the second heat conduction layer 6 to reach the cold end. The heat series structure is adopted, a heat conduction distance is increased, a heat conduction section area is reduced, the total heat resistance of the thermoelectric power generator is increased, heat conduction is prevented by isolation and non contact between the first heat conduction layer 5 and the cold end, a greater temperature difference between the two end surfaces of the thermoelectric power generator is realized in the case of a limited heat dissipation effect of the radiator, and the output power of the thermoelectric power generator is increased under the working condition.

BRIEF DESCRIPTION OF THE DRAWINGS

Those of ordinary skill in the art can make clear various other advantages and benefits of the present invention by reading the detailed description in the preferred specific embodiments hereunder. Accompanying drawings in the specification are only used for the purpose of illustrating the preferred embodiments, and are not considered as a limitation to the present invention. Obviously, the accompanying drawings described below are only some embodiments of the present invention, and those of ordinary skill in the art can obtain other accompanying drawings based on these accompanying drawings without creative work. Furthermore, in the whole accompanying drawing, same reference numerals are used to denote same parts.

In the accompanying drawing:

FIG. 1 is a structural schematic diagram of a thermoelectric power generator according to an embodiment of the present invention.

The present invention is further explained below in combination with the accompanying drawing and the embodiments.

DETAILED DESCRIPTION OF THE EMBODIMENTS

The specific embodiments of the present invention will be described in detail with reference to the accompanying drawing. Although the specific embodiments of the present invention are shown in the accompanying drawing, it should be understood that the present invention can be implemented in various forms, rather than being limited by the embodiments illustrated herein. On the contrary, these embodiments are provided to understand the present invention more thoroughly and to completely convey the scope of the present invention to those skilled in the art.

It should be noted that some words used in the specification and claims are used to refer to specific components. Those skilled in the art should understand that technical staff may use different terms to refer to the same component. The specification and claims distinguish components not based on the differences of the terms, but based on the differences in functions of the components. For example, the term "include" or "comprise" mentioned in the entire specification and claims is an open term, so that it should be interpreted as "including but not limited to". The following description of the specification is about the preferred embodiments for implementing the present invention, but the description is based on the general principle of the specification and is not intended to limit the scope of the present invention. The protection scope of the present invention should be based on those defined by the appended claims.

In order to facilitate the understanding of the embodiments of the present invention, further explanation will be made below by taking the specific embodiments as examples in combination with the accompanying drawings, and the various accompanying drawings do not constitute a limitation to the embodiments of the present invention.

In order to better understand, as shown in FIG. 1, a thermoelectric power generator includes:

a first heat conduction and insulation end surface 1, a first heat insulation layer 4, which is paved on a partial lower surface of the first heat conduction and insulation end surface 1, a first heat conduction layer 5, which is paved on a lower surface of the first heat insulation layer 4, a first electric conduction electrode 3, which is arranged on a lower surface of the first heat conduction layer 5 and a lower surface of the first heat conduction and insulation end surface 1, a second electric conduction electrode 8, which is arranged opposite to the first electric conduction electrode 3 and adaptive to the first electric conduction electrode 3, a thermoelectric component 2, which includes a plurality of P—N type thermoelectric arms connected in series, and is arranged between the first electric conduction electrode 3 and the second electric conduction electrode 8, a second heat conduction layer 6, which is arranged adjacent to the second electric conduction electrode 8, a second heat insulation layer 7, which is paved on a lower surface of the second heat conduction layer, and a second heat conduction and insulation end surface 9, which is arranged opposite to the first heat conduction and insulation end surface 1, wherein an upper surface of the second heat conduction and insulation end surface 9 is in partial contact with the second electric conduction electrode 8 and in partial contact with the second heat insulation layer 7.

In a preferred embodiment of the thermoelectric power generator, the first heat conduction and insulation end surface 1 has a stepped structure, and the first heat insulation layer 4 and the first heat conduction layer 5 are arranged at a thinner position of the stepped structure, so that the first heat conduction layer 5 is parallel and level to a thicker position of the stepped structure. The second heat conduction and insulation end surface 9 has a stepped structure, and the second heat insulation layer 7 and the second heat conduction layer 6 are arranged at a thinner position of the stepped structure, so that the second heat conduction layer 6 is parallel and level to a thicker position of the stepped structure. The stepped structure is beneficial to reducing a heat conduction section area, and to breaking heat conduction with a thicker end surface. The thermoelectric power generator significantly improves the efficiency under a working condition of a limited volume, is easy to install and adapts to various installation environments.

In a preferred embodiment of the thermoelectric power generator, an arrangement mode of the P—N type thermoelectric arms is changed into an N—P—N mode from a P—N—P mode at a heat series exchange position.

In a preferred embodiment of the thermoelectric power generator, an arrangement mode of the P—N type thermoelectric arms is changed into a P—N—P mode from an N—P—N mode at a heat series exchange position.

In a preferred embodiment of the thermoelectric power generator, the first heat insulation layer 4 and/or the second heat insulation layer 7 include/includes glass fiber, asbestos, vermiculite or a microporous calcium silicate material.

In a preferred embodiment of the thermoelectric power generator, the first heat conduction layer 5 and/or the second heat conduction layer 6 include/includes insulation materials containing metal oxide, carbide and/or metal nitride.

In a preferred embodiment of the thermoelectric power generator, wherein the metal oxide includes magnesium oxide, aluminum oxide or nickel oxide, the carbide includes silicon carbide, and the metal nitride includes aluminum nitride or silicon nitride.

In a preferred embodiment of the thermoelectric power generator, the thermoelectric component 2 includes at least one group of heat series structures, at least one group of k thermoelectric arms and at least one group of n-k thermoelectric arms.

In a preferred embodiment of the thermoelectric power generator, a heat conduction coefficient of the second heat conduction layer 6 is the same as that of the first heat conduction layer 5.

In a preferred embodiment of the thermoelectric power generator, a heat insulation coefficient of the second heat insulation layer 7 is the same as that of the first heat insulation layer 4.

In a preferred embodiment of the thermoelectric power generator, a length of the first heat insulation layer 4 is at least half of a length of the first heat conduction and insulation end surface 1. Further, the length of the first heat insulation layer 4 is one third of the length of the first heat conduction and insulation end surface 1.

In a preferred embodiment of the thermoelectric power generator, a length of the second heat insulation layer 7 is at least half of a length of the second heat conduction and insulation end surface 9. Further, the length of the second heat insulation layer 7 is one third of the length of the second heat conduction and insulation end surface 9.

In a preferred embodiment of the thermoelectric power generator, a gap is reserved between the first heat conduction layer 5 and a step of the first heat conduction and insulation end surface 1.

In a preferred embodiment of the thermoelectric power generator, a gap is reserved between the second heat conduction layer 6 and a step of the second heat conduction and insulation end surface 9. Further, the gap is smaller than a gap between the P—N type thermoelectric arms connected in series.

In order to further understand the present invention, in an embodiment, the thermoelectric power generator in which thermoelectric arms are of a heat series structure is internally provided with one group of or more than one group of heat series structures, and includes a first heat conduction and insulation end surface 1, a thermoelectric component 2 of PN type thermoelectric arms, a first electric conduction electrode 3, a first heat insulation layer 4 and a first heat conduction layer 5.

The first heat conduction and insulation end surface 1 uses insulation materials with good heat conduction performance, such as metal oxides (magnesium oxide, aluminum oxide, nickel oxide, etc.), carbides (silicon carbide, etc.), and metal nitrides (aluminum nitride, silicon nitride, etc.).

An arrangement mode of the PN type thermoelectric arms is changed into an N—P—N mode from a P—N—P mode at a heat series exchange position.

The first electric conduction electrode 3 uses materials with high electric conductivity, such as copper and aluminum The heat insulation layer uses materials such as glass fiber, asbestos, vermiculite and microporous calcium silicate.

The heat conduction layer uses insulation materials with good heat conduction performance, such as metal oxides (magnesium oxide, aluminum oxide, nickel oxide, etc.), carbides (silicon carbide, etc.), and metal nitrides (aluminum nitride, silicon nitride, etc.).

In an embodiment, the thermoelectric power generator has a novel structure, and includes a heat conduction and insulation end surface, P and N type thermoelectric arms, an electric conduction electrode, a heat insulation material layer and a heat conduction material layer.

In an embodiment, In order to facilitate calculation, it is assumed that the heat insulation material layer has ideal heat insulation, and the heat conduction material layer and the heat conduction and insulation end surface have ideal heat conduction. The temperature difference between a heat source of a hot end of the thermoelectric power generator and the air is $\Delta T$, the total heat resistance of a thermoelectric power generator with a conventional structure is RTEG, the combined heat resistance of a radiator and the air is Rrad, the thermoelectric power generator includes n thermoelectric arms, the thermoelectric power generator of the present invention includes one group of heat series structure, one group of k thermoelectric arms and one group of n-k thermoelectric arms, and the total heat resistance of the thermoelectric power generator of the present invention is RTEG'. A seebeck coefficient of a thermoelectric material used in the thermoelectric arms is S. The temperature difference between cold and hot ends of the thermoelectric power generator in the prior art is $$\frac{\Delta T \cdot R_{TEG}}{R_{TEG} + R_{rad}},$$

an output open circuit voltage is $$\frac{\Delta T \cdot R_{TEG}}{R_{TEG} + R_{rad}} \cdot n \cdot S.$$

According to a heat resistance calculation formula $$R = \frac{L}{\lambda \cdot S}$$

in which $\lambda$ is a heat conduction coefficient, L is a material thickness, and S is a heat transfer area, the heat resistance of the thermoelectric power generator of the present invention is $$R'_{TEG} = \frac{n}{k}R_{TEG} + \frac{n}{n-k}R_{TEG},$$

the temperature difference of cold and hot ends of the thermoelectric power generator of the present invention is $$\frac{\Delta T \cdot R'_{TEG}}{R'_{TEG} + R_{rad}},$$

an output open circuit voltage is $$\frac{\Delta T}{R'_{TEG} + R_{rad}} \frac{n}{k} R_{TEG} \cdot k \cdot S + \frac{\Delta T}{R'_{TEG} + R_{rad}} \frac{n}{n-k} R_{TEG} \cdot (n-k) \cdot S.$$

When RTEG is less than $$\frac{1}{2}R_{rad}, \frac{\Delta T}{R'_{TEG} + R_{rad}} \frac{n}{k} R_{TEG} \cdot k \cdot S + \frac{\Delta T}{R'_{TEG} + R_{rad}} \frac{n}{n-k} R_{TEG} \cdot (n-k) \cdot S.$$

is greater than $$\frac{\Delta T \cdot R_{TEG}}{R_{TEG} + R_{rad}} \cdot n \cdot S,$$

that is, when the heat resistance of the thermoelectric power generator is less than a half of the combined heat resistance of the radiator and the air, the thermoelectric power generator of the present invention has a greater output open circuit voltage than the thermoelectric power generator in the prior art. In the same way, the same mathematical verification can be performed for multiple groups of heat series structures. In an experimental test, an air environment is at 20° C., and when a temperature of the hot end of the conventional thermoelectric power generator is 57° C., the cold end uses an aluminum radiator with the same section area to dissipate heat in the case of natural convection. At the moment, the temperature difference on the thermoelectric power generator in the prior art is about 6° C., and the temperature difference between the radiator and an environment temperature is about 31° C. Therefore, the heat resistance of the thermoelectric power generator is much less than a half of the combined heat resistance of the radiator and the air, and in the case of limited heat dissipation, the thermoelectric power generator of the present invention can generate greater temperature difference on the end surface, thereby having greater output power.

Although the embodiments of the present invention are described above in combination with the accompanying drawing, the present invention is not limited to the above specific embodiments and application fields, and the above specific embodiments are only for illustration and instruction, rather than constructing a limitation. Under the enlightenment of the specification, those of ordinary skill in the art can also make multiple forms without departing from the protection scope of the claims of the present invention, and these forms all fall within the protection scope of the present invention.

The invention claimed is:

1. A thermoelectric power generator, comprising
   a first end surface,
   a first heat insulation layer, which is paved on a partial lower surface of the first end surface,
   a first heat conduction layer, which is paved on a lower surface of the first heat insulation layer,
   a first electric conduction electrode, which is arranged on a lower surface of the first heat conduction layer and a lower surface of the first end surface,
   a second electric conduction electrode, which is arranged opposite to the first electric conduction electrode,
   a thermoelectric component, which comprises a plurality of P—N type thermoelectric arms connected in series, and is arranged between the first electric conduction electrode and the second electric conduction electrode,
   a second heat conduction layer, which is arranged adjacent to the second electric conduction electrode,
   a second heat insulation layer, which is paved on a lower surface of the second heat conduction layer, and
   a second end surface, which is arranged opposite to the first end surface, wherein an upper surface of the second end surface is in partial contact with the second electric conduction electrode and in partial contact with the second heat insulation layer;
   wherein the first end surface has a stepped structure, and the first heat insulation layer and the first heat conduction layer are arranged at a thinner position of the stepped structure, so that the first heat conduction layer is parallel and level to a thicker position of the stepped structure; and the second end surface has a stepped structure, and the second heat insulation layer and the second heat conduction layer are arranged at a thinner position of the stepped structure, so that the second heat conduction layer is parallel and level to a thicker position of the stepped structure.

2. The thermoelectric power generator according to claim 1, wherein the first heat insulation layer and/or the second heat insulation layer comprise/comprises glass fiber, asbestos, vermiculite or a microporous calcium silicate material.

3. The thermoelectric power generator according to claim 1, wherein the first heat conduction layer and/or the second heat conduction layer comprise/comprises insulation materials containing metal oxide, carbide and/or metal nitride.

4. The thermoelectric power generator according to claim 3, wherein the metal oxide comprises magnesium oxide, aluminum oxide or nickel oxide, the carbide comprises silicon carbide, and the metal nitride comprises aluminum nitride or silicon nitride.

* * * * *